US009101062B2

(12) United States Patent
Aoyagi et al.

(10) Patent No.: US 9,101,062 B2
(45) Date of Patent: Aug. 4, 2015

(54) HIGHLY HEAT CONDUCTIVE POLYIMIDE FILM, HIGHLY HEAT CONDUCTIVE METAL-CLAD LAMINATE, AND METHOD FOR PRODUCING THE SAME

(75) Inventors: Eijiro Aoyagi, Kisarazu (JP); Hongyuan Wang, Kisarazu (JP); Noriyuki Kirikae, Kisarazu (JP); Katsufumi Hiraishi, Tokyo (JP)

(73) Assignee: NIPPON STEEL & SUMIKIN CHEMICAL CO., LTD., Tokyo (JP)

( * ) Notice: Subject to any disclaimer, the term of this patent is extended or adjusted under 35 U.S.C. 154(b) by 858 days.

(21) Appl. No.: 13/061,740

(22) PCT Filed: Sep. 7, 2009

(86) PCT No.: PCT/JP2009/065582
§ 371 (c)(1),
(2), (4) Date: Mar. 2, 2011

(87) PCT Pub. No.: WO2010/027070
PCT Pub. Date: Mar. 11, 2010

(65) Prior Publication Data
US 2011/0165410 A1    Jul. 7, 2011

(30) Foreign Application Priority Data

Sep. 8, 2008  (JP) ................................. 2008-229706
Sep. 29, 2008  (JP) ................................. 2008-250074

(51) Int. Cl.
*H05K 1/03* (2006.01)
*B32B 15/08* (2006.01)
*B32B 27/20* (2006.01)
*C08K 7/00* (2006.01)
*C08K 3/22* (2006.01)
*C08K 3/38* (2006.01)

(52) U.S. Cl.
CPC .............. *H05K 1/0373* (2013.01); *B32B 15/08* (2013.01); *B32B 27/20* (2013.01); *C08K 7/00* (2013.01); *H05K 1/0346* (2013.01); *C08K 2003/2227* (2013.01); *C08K 2003/382* (2013.01); *H05K 2201/0154* (2013.01); *H05K 2201/0209* (2013.01); *H05K 2201/0245* (2013.01); *Y10T 428/25* (2015.01); *Y10T 428/252* (2015.01); *Y10T 428/256* (2015.01); *Y10T 428/257* (2015.01)

(58) Field of Classification Search
CPC ................... H05K 1/0373; H05K 2201/0272; H05K 2201/0245; Y10T 428/25
See application file for complete search history.

(56) References Cited

U.S. PATENT DOCUMENTS

| 6,048,919 A * | 4/2000 | McCullough .................. 524/404 |
| 2002/0050585 A1* | 5/2002 | Masayuki et al. ............. 252/500 |
| 2007/0149758 A1* | 6/2007 | Wang et al. .................... 528/310 |

FOREIGN PATENT DOCUMENTS

| JP | 3-200397 A | | 9/1991 |
| JP | 03200397 A | * | 9/1991 |
| JP | 5-16296 A | | 1/1993 |
| JP | 5-70317 A | | 3/1993 |
| JP | 2004-189938 A | | 7/2004 |
| JP | 2005-51131 A | | 2/2005 |
| JP | 2005-171206 A | | 6/2005 |
| JP | 2006-103237 A | | 4/2006 |
| JP | 2006-169534 A | | 6/2006 |
| JP | 4089636 B2 | | 5/2008 |

OTHER PUBLICATIONS

International Preliminary Report on Patentability for Application No. PCT/JP2009/065582 mailed Apr. 28, 2011.
International Search Report for the Application No. PCT/JP2009/065582 mailed Oct. 13, 2009.
International Preliminary Report on Patentability for Application No. PCT/JP2009/065582 mailed Mar. 17, 2011.

* cited by examiner

*Primary Examiner* — Elizabeth A Robinson
(74) *Attorney, Agent, or Firm* — Cheng Law Group, PLLC

(57) ABSTRACT

A highly heat conductive metal-clad laminate, which may be included in a highly heat conductive polyimide film, has a metal layer on one or both sides of an insulating layer which has a heat conductive filler-filled polyimide layer. The insulating layer of the highly heat conductive metal-clad laminate or the highly heat conductive polyimide film having the filler-filled polyimide layer is characterized in that the content of the heat conductive filler in the filler-filled polyimide layer is 20-80 wt %, the heat conductive filler contains a plate-like filler with an average length $D_L$ of 0.1-15 μm and a spherical filler with an average particle diameter $D_R$ of 0.05-10 μm, $D_L$ and $D_R$ satisfy the relationship $D_L > D_R/2$, no heat conductive filler of 30 μm or more is contained, and the coefficient of thermal expansion is in the range of 10-30 ppm/K.

4 Claims, No Drawings

HIGHLY HEAT CONDUCTIVE POLYIMIDE FILM, HIGHLY HEAT CONDUCTIVE METAL-CLAD LAMINATE, AND METHOD FOR PRODUCING THE SAME

TECHNICAL FIELD

This invention relates to a polyimide film of excellent thermal conductivity properties, a highly heat conductive metal-clad laminate in which a layer of the said polyimide film is provided as an insulating layer, and a method for producing the same.

BACKGROUND TECHNOLOGY

In recent years, there has been a growing demand for reduction in size and weight of electronic devices as typified by mobile phones and, to meet this demand, flexible circuit board substrates which are advantageous to reduction in size and weight of electronic devices are coming into wide use in the field of electronics. In particular, flexible circuit board substrates in which a polyimide resin is used as an insulating layer have been in wide use on account of their good heat resistance and chemical resistance. A higher degree of integration of the circuitry realized recently by miniaturization of electronic devices and high speed and reliability of information processing have in concert turned attention of the parties concerned to the question of how to dissipate heat generated in the devices.

It is considered effective to improve the thermal conductivity properties of electronic devices in order to improve the capability of dissipating heat generated in the devices and studies are conducted to develop technologies for incorporation of a heat conductive filler in an insulating layer which constitutes a wiring board substrate or the like. In this case, a filler of high thermal conductivity such as aluminum oxide, boron nitride, aluminum nitride, and silicon nitride is incorporated in a resin which forms the insulating layer.

In an attempt to obtain exceptionally high thermal conductivity by application of this kind of technology, a heat-dissipating sheet filled with a combination of a plate-like heat conductive filler and a spherical heat conductive filler is reported in patent document 1. That is, the aim here is to improve the heat-dissipating capability by distributing the plate-like heat conductive filler in multiple layers in the matrix resin and distributing the spherical heat conductive filler between the layers of the plate-like filler. However, the plate-like heat conductive filler tends to form agglomerates and some of agglomerates which are thicker than the heat-dissipating sheet may protrude from the sheet thereby worsening the surface condition of the insulating layer and adversely affecting the external appearance of the sheet.

A heat conductive polyimide film composite in which particles of a heat conductive filler are dispersed is described in patent document 2 as a material useful for a polyimide-metal laminate. However, the disclosure made in such a wide range as in patent document 2 is not sufficient to produce a material which satisfies various properties required for flexible board substrates. That is, the coefficient of linear expansion increases when a non-plate-like filler alone is used. Moreover, it is difficult to provide the film with high thermal conductivity by using a filler of low thermal conductivity such as aluminum oxide alone and increasing the content of filler to obtain high thermal conductivity markedly deteriorates the properties of the film.

Further, a heat conductive resin sheet filled with a mixture of a granular inorganic filler and a flat filler is described in patent document 3; however, the sheet is defective in that high thermal conductivity cannot be obtained when the sheet is thin because of the average particle diameter of the granular inorganic filler being 1 to 3.6 times that of the flat filler. Still further, a highly heat-dissipating composition using a mixed filler of scaly boron nitride and a granular metal oxide is described in patent document 4; however, the heat distortion temperature of the resin ranges from −30° C. to 130° C. and the composition is not suitable for use in wiring board substrates intended for high-temperature packaging of semiconductors and the like.

PRIOR ART LITERATURE

Patent Documents

Patent document 1: JP05-70317 B
Patent document 2: JP2006-169534 A
Patent document 3: JP4089636 C
Patent document 4: JP05-16296 A

SUMMARY OF THE INVENTION

As described above, in the field of electronic materials intended for use in wiring board substrates and the like where heat resistance and dimensional stability are required, there has been a growing demand for development of highly heat conductive metal-clad laminates which satisfy the said properties, show excellent thermal conductivity properties, and contain an insulating layer of good surface characteristics and of polyimide films suitable therefor. Under the circumstances, an object of this invention is to provide a highly heat conductive metal-clad laminate which shows excellent heat resistance, dimensional stability, thermal conductivity properties, workability, and adhesiveness and provides an insulating layer of flat surface when exposed in fabrication of a wiring board substrate and the like and, further, to provide a highly heat conductive polyimide film which shows excellent heat resistance, dimensional stability, and thermal conductivity properties and is flat on the surface and easy to work with.

The inventors of this invention have conducted intensive studies to solve the aforementioned problems, found that incorporation of a plurality of heat conductive fillers solves the problems, and completed this invention.

This invention relates to a highly heat conductive metal-clad laminate having an insulating layer containing at least one layer of a heat conductive filler-filled polyimide resin and a metal layer on one or both sides of the insulating layer, wherein the content of the heat conductive filler in the filled polyimide resin layer is 20-80 wt %, the heat conductive filler contains a plate-like filler with an average length $D_L$ of 0.1-15 µm and a spherical filler with an average particle diameter $D_R$ of 0.05-10 µm, the average length $D_L$ and the average particle diameter $D_R$ satisfy the relationship $D_L > D_R/2$, no heat conductive filler of 30 µm or more is contained, and the coefficient of thermal expansion of the insulating layer is in the range of 10-30 ppm/K.

Further, this invention relates to a method for producing a highly heat conductive metal-clad laminate having an insulating layer containing at least one layer of a heat conductive filler-filled polyimide resin and showing a coefficient of thermal expansion in the range of 10-30 ppm/K which comprises applying a polyamic acid solution containing 20-80 wt % of a heat conductive filler to a metal layer or to a metal layer coated with a polyimide resin or a precursor thereof followed by drying and curing, wherein the said heat conductive filler contains a plate-like filler with an average length $D_L$ of 0.1-15

µm and a spherical filler with an average particle diameter $D_R$ of 0.05-10 µm, the average length $D_L$ and the average particle diameter $D_R$ satisfy the relationship $D_L > D_R/2$, and no heat conductive filler of 30 µm or more is contained.

Still further, this invention relates to a polyimide film containing at least one layer of a heat conductive filler-filled polyimide resin wherein the content of the heat conductive filler in the filled polyimide resin layer is 20-80 wt %, the heat conductive filler contains a plate-like filler with an average length $D_L$ of 0.1-15 µm and a spherical filler with an average particle diameter $D_R$ of 0.05-10 µm, the average length $D_L$ and the average particle diameter $D_R$ satisfy the relationship $D_L > D_R/2$, no heat conductive filler of 30 µm or more is contained, and the coefficient of thermal expansion of the polyimide film is in the range of 10-30 ppm/K.

PREFERRED EMBODIMENTS OF THE INVENTION

The highly heat conductive polyimide film of this invention contains at least one layer of a heat conductive filler-filled polyimide resin. Moreover, the highly heat conductive metal-clad laminate of this invention has an insulating layer and a metal layer on one or both sides of the insulating layer. Further, the highly heat conductive polyimide film of this invention is constituted similarly to the insulating layer of the highly heat conductive metal-clad laminate. That is, the insulating layer obtained by removing the metal layer from the highly heat conductive metal-clad laminate is the same in constitution as the highly heat conductive polyimide film. Thus, the highly heat conductive metal-clad laminate of this invention may be said to have an insulating layer constituted of the highly heat conductive polyimide film of this invention.

It is to be understood, unless otherwise noted, that what will be explained about the insulating layer below in the specification will hold true for the highly heat conductive polyimide film.

The highly heat conductive metal-clad laminate of this invention consists of an insulating layer and a metal layer on one or both sides of the insulating layer. The insulating layer is constituted of a polyimide resin and at least one constituent thereof is a layer of a heat conductive filler-filled polyimide resin. The insulating layer may be constituted of a filler-filled polyimide layer alone or may additionally contain a filler-free polyimide layer. In the case where the insulating layer additionally contains a filler-free polyimide layer, the thickness of the filler-free polyimide layer is controlled in the range of 1/100 to 1/2, preferably in the range of 1/20 to 1/3, of the thickness of the filler-filled polyimide layer. In this case, the filler-free polyimide layer is placed in contact with the metal layer to improve the adhesion between the metal layer and the insulating layer.

According to this invention, the heat conductive filler contains a plate-like filler and a spherical filler and the filler-filled polyimide layer contains 20-80 wt %, preferably 30-60 wt %, of the sum of the plate-like filler and the spherical filler. When the content of the heat conductive filler is less than 20 wt %, the thermal conductivity properties become too low to be sufficient for a heat-dissipating material. When the content exceeds 80 wt %, the insulating layer becomes brittle and difficult to handle; besides, in the case where the insulating layer is formed from a polyamic acid solution, the solution or the varnish becomes highly viscous and the workability deteriorates. The content of the spherical filler in the heat conductive filler is preferably controlled in the range of 25-70 wt %. In the case where the insulating layer additionally contains a filler-free polyimide layer, the content of the heat conductive filler in the whole insulating layer is preferably controlled in the range of 30-60 wt %.

The plate-like filler in this invention refers to a plate-like or scaly filler whose average thickness is sufficiently smaller than, preferably 1/2 or less of, the average length or the average width on the surface. The plate-like filler to be used in this invention has an average length $D_L$ in the range of 0.1-15 µm. When the average length $D_L$ is less than 0.1 µm, the thermal conductivity becomes lower, the coefficient of thermal expansion becomes larger, and the effect of being plate-like or scaly lessens. When the average length $D_L$ exceeds 15 µm, orientation becomes difficult to achieve at the film-forming time. Here, the average length $D_L$ means the average length of the longest line drawn through the body of a plate-like filler. Preferable examples of the plate-like filler include boron nitride and aluminum oxide and they may be used singly or as a mixture of two kinds or more. The average length $D_L$ is preferably in the range of 0.5-10 µm from the viewpoint of high thermal conductivity. The plate-like filler best suited for use in this invention is boron nitride with an average length $D_L$ of 2-9 µm. The average length means the median length and the mode length is preferably one peak in the aforementioned range and this holds true for the spherical filler.

The spherical filler refers to a filler shaped like or nearly like a sphere in which the ratio of average long diameter to average short diameter is 1 or close to 1 (preferably 0.8 or more). The spherical filler to be used in this invention specifically has an average particle diameter $D_R$ in the range of 0.05-10 µm. When the average particle diameter $D_R$ is less than 0.05 µm, the effect of enhancing the thermal conductivity lessens. On the other hand, when the average particle diameter $D_R$ exceeds 10 µm, it becomes difficult for a spherical filler to enter between the layers of a plate-like filler and the effect of this invention becomes difficult to control. The average particle diameter $D_R$ here means the average diameter of particles of a spherical filler (median diameter). Preferable examples of the spherical filler include aluminum oxide, fused silica, and aluminum nitride and they may be used singly or as a mixture of two kinds or more. Further, the average particle diameter $D_R$ is preferably in the range of 0.1-6 µm for ease of filling. The spherical filler best suited for use in this invention is aluminum oxide with an average particle diameter $D_R$ of 0.5-3.0 µm. Although aluminum oxide shows low thermal conductivity, this shortcoming can be overcome by using both of plate-like and spherical fillers. In the case where higher thermal conductivity is desirable, it is preferable to use a filler other than aluminum oxide for either or both of plate-like and spherical fillers. The heat conductive filler as referred to in this invention preferably has a thermal conductivity of 1.0 W/mK or more.

The heat conductive filler is characterized in that the average length $D_L$ and the average particle diameter $D_R$ are related to each other as $D_L > D_R/2$ and no heat conductive filler of 30 µm or more is contained. The thermal conductivity may become lower when the relationship $D_L > D_R/2$ is not satisfied. Incorporation of a heat conductive filler of 30 µm or more degrades the external appearance of the surface. More preferably, the average length $D_L$ and the average particle diameter $D_R$ are related to each other as $D_L > D_R$. The ratio $D_R/D_L$ is preferably in the range of 1/3 to 5/3.

The content of a heat conductive filler with a particle diameter of 9 µm or more is controlled preferably at 50 wt % or less of the total. In particular, the content of a plate-like filler with a particle diameter of 9 µm or more is controlled preferably at 50 wt % or less of the total. Controlling the filler content in this manner can eliminate the unevenness on the surface of the insulating layer and provide a flat surface. The particle diameter means the length in the case of a plate-like filler, The aforementioned insulating layer is constituted of a polyimide resin. A polyimide resin is generally represented by the following general formula (1) and it can be produced by a known method which comprises polymerizing substantially equimolar quantities of a diamine component and an acid dianhydride component in an organic polar solvent.

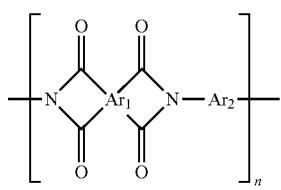
(1)

In general formula (1), $Ar_1$ is a tetravalent organic group containing one or more aromatic rings and $Ar_2$ is a divalent organic group containing one or more aromatic rings. It may be said that $Ar_1$ is a group corresponding to the residue of an acid dianhydride and $Ar_2$ is a group corresponding to the residue of a diamine.

An aromatic tetracarboxylic acid dianhydride represented by $O(CO)_2—Ar_1—(CO)_2O$ is preferred as an acid dianhydride and examples include those aromatic tetracarboxylic acids which yield the tetravalent groups shown below as $Ar_1$.

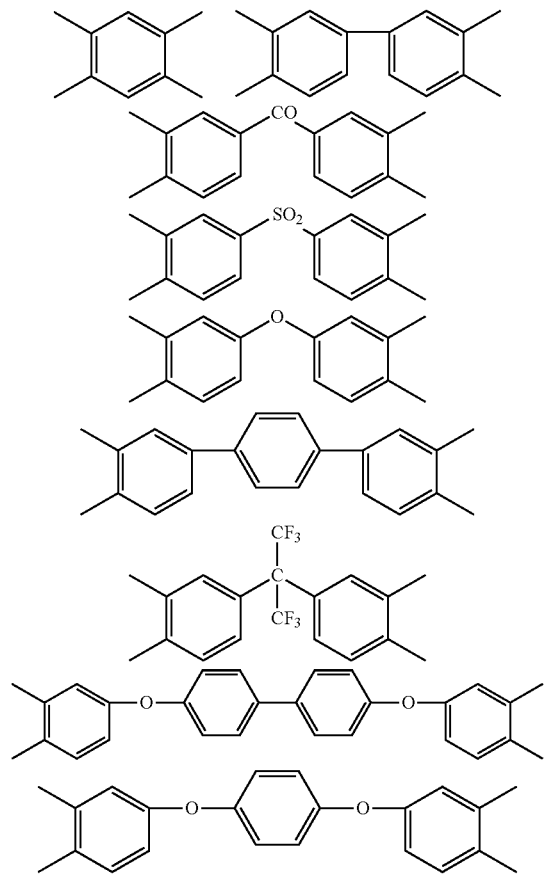

-continued

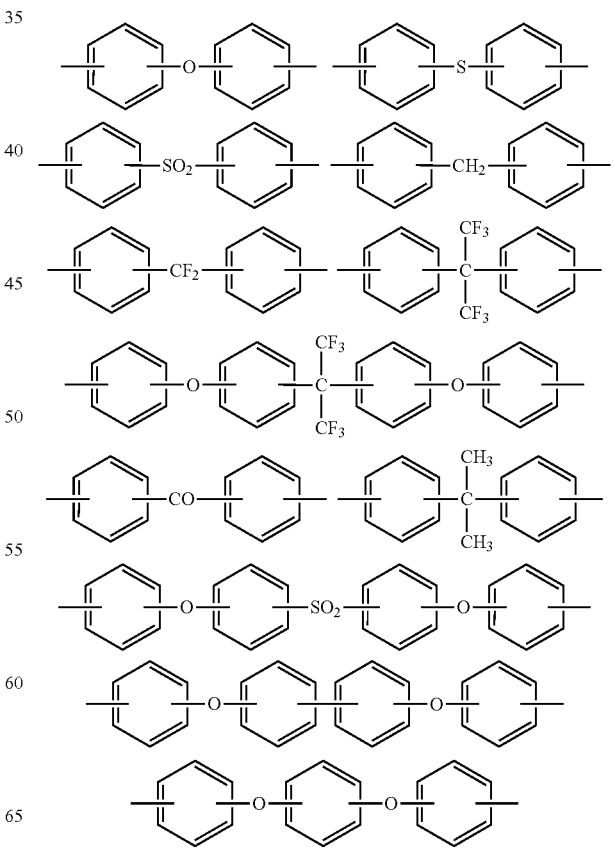

The acid dianhydrides may be used singly or as a mixture of two kinds or more. The acid dianhydride to be used in this invention is preferably selected from pyromellitic dianhydride (PMDA), 3,3',4,4'-biphenyltetracarboxylic acid dianhydride (BPDA), 3,3',4,4'-benzophenonetetracarboxylic acid dianhydride (BTDA), 3,3',4,4'-diphenylsulfonetetracarboxylic acid dianhydride (DSDA), and 4,4'-oxydiphthalic dianhydride (ODPA).

An aromatic diamine represented by $H_2N—Ar_2—NH_2$ is preferred as a diamine and examples include those aromatic diamines which yield the divalent groups shown below as $Ar_2$.

-continued

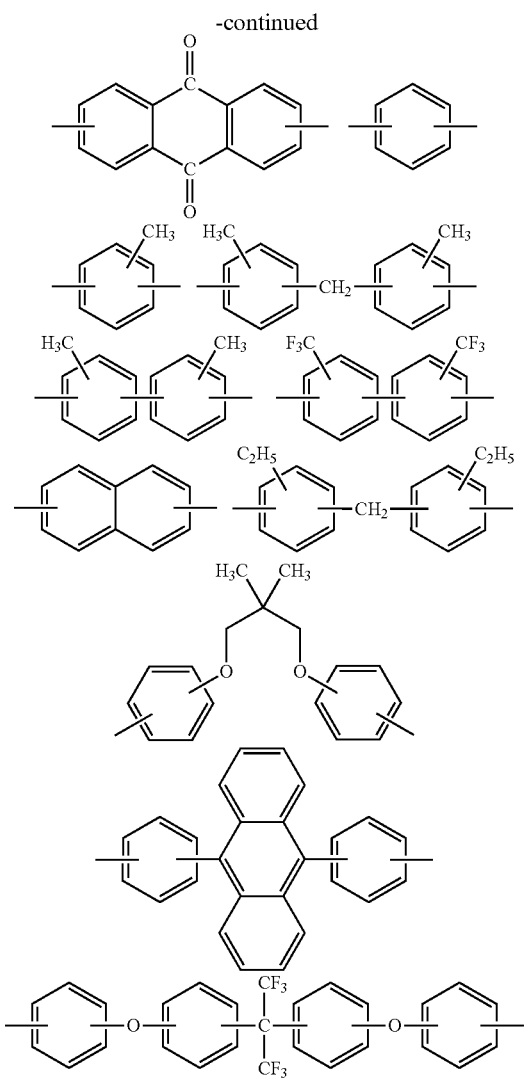

Of these aromatic diamines, diaminodiphenyl ether (DAPE), 2,2'-dimethyl-4,4'-diaminobiphenyl (m-TB), paraphenylenediamine (p-PDA), 1,3-bis(4-aminophenoxy)benzene (TPE-R), 1,3-bis(3-aminophenoxy)benzene (APB), 1,4-bis(4-aminophenoxy)benzene (TPE-Q), and 2,2-bis[4-(4-aminophenoxy)phenyl]propane (BAPP) are preferred.

The solvents useful for polymerization include dimethylacetamide, N-methylpyrrolidinone, 2-butanone, diglyme, and xylene and they may be used singly or as a mixture of two kinds or more. The polyamic acid (a polyimide precursor) to be obtained by the polymerization preferably shows a resin viscosity in the range of 500-35,000 cps.

The method for forming the insulating layer of a highly heat conductive metal-clad laminate is not specifically limited and any of known methods may be adopted. For example, a representative method in general use comprises preparing a solution of a polyamic acid or a polyimide precursor containing a heat conductive filler as a raw material for the insulating layer, casting the solution directly onto a metal foil such as a copper foil, removing the solvent to some extent by drying the cast solution at a temperature below 150° C., and effecting imidization at a temperature in the range of 100-450° C., preferably in the range of 300-450° C., for a period of 5-40 minutes to form the target insulating layer made up of a heat conductive filler-filled polyimide resin on the metal foil. As will be described later, in the case where the insulating layer is made up of two or more layers of polyimide resins, a solution of the first polyamic acid is applied and dried, then a solution of the second polyamic acid is applied to the layer of the first polyamic acid and dried, and when the third and other polyamic acids are additionally required, solutions of such additional polyamic acids are similarly applied and dried one upon another, and the whole polyamic acids are imidized together at a temperature in the range of 300-450° C. for a period of 5-40 minutes. When the temperature for this heat treatment is below 100° C., the dehydration and ring closure reaction of the polyamic acid does not proceed sufficiently. On the other hand, when the temperature exceeds 450° C., the polyimide layer and the copper foil may deteriorate as a result of oxidation and the like.

Another known method comprises casting a solution of a polyamic acid containing a heat conductive filler or a raw material of the insulating layer onto an arbitrarily chosen support, drying the cast solution on the support by heating to form a self-supporting gel film, peeling off the film from the support, and imidizing the film by heating at high temperatures to yield a polyimide film (a highly heat conductive polyimide film). A highly heat conductive metal-clad laminate containing this polyimide film as an insulating layer is generally produced by heat contact bonding of a metal foil to the polyimide film with or without the use of an adhesive or by vapor deposition of a metal on the polyimide film.

The aforementioned polyamic acid solution containing a heat conductive filler for forming the insulating layer is prepared by adding the filler directly to the polyamic acid solution. Alternatively, in consideration of the dispersibility of the filler, the filler is added in advance to a reaction solvent into which one of the raw materials (an acid dianhydride component or a diamine component) has been thrown and then polymerization is allowed to proceed with stirring.

The insulating layer is constituted of a single layer or multiple layers and a multilayer structure may be adopted to improve the dimensional stability of the laminate or the adhesive strength of the insulating layer to the metal foil. In the case where the insulating layer is constituted of multiple layers, a heat conductive filler is preferably incorporated in each polyimide layer. This invention does not exclude the use of an adhesive in bonding of a filler-filled polyimide resin layer to a metal foil. In the case where an adhesive is used for forming a highly heat conductive metal-clad laminate having metal layers on both sides of its insulating layer, the thickness of the adhesive layer is controlled in the range less than 30%, preferably less than 20%, of the total thickness of the insulating layer. In the case where an adhesive is used for forming a highly heat conductive metal-clad laminate having a metal layer on one side of the insulating layer, the thickness of the adhesive layer is controlled in the range less than 15%, preferably less than 10%, of the total thickness of the insulating layer. As the adhesive layer constitutes a part of the insulating layer, the adhesive is preferably a polyimide resin. The glass transition temperature of a polyimide resin that principally constitutes the insulating layer is preferably 300° C. or above from the viewpoint of heat resistance. A glass transition temperature of 300° C. or above can be attained by properly selecting the aforementioned acid dianhydride and diamine components.

The thickness of the insulating layer is controlled in the range of 5-200 µm, preferably in the range of 10-50 µm. When the thickness is less than 10 µm, there arises a possibility that a defect such as wrinkling may develop on the metal foil during transport in the production of flexible board substrates.

When the thickness exceeds 200 μm, there may occur a problem in the flexibility of flexible board substrates.

The coefficient of thermal expansion (CTE) of the insulating layer must be in the range of $10 \times 10^{-6}$/K to $30 \times 10^{-6}$/K, preferably in the range of $15 \times 10^{-6}$/K to $25 \times 10^{-6}$/K. When the coefficient of thermal expansion is smaller than $10 \times 10^{-6}$/K, the laminate tends to curl and becomes less easy to handle. On the other hand, when the coefficient of thermal expansion exceeds $30 \times 10^{-6}$/K, the dimensional stability as a flexible board substrate tends to deteriorate and the heat resistance tends to deteriorate as well.

The thermal conductivity of the insulating layer is advantageously 0.5 W/mK or more in the direction of thickness and 1.0 W/mK or more in the direction of plane. More advantageously, it is 1.0 W/mK or more in the direction of thickness and 2.5 W/mK or more in the direction of plane. A highly heat conductive polyimide film or a highly heat conductive metal-clad laminate which is useful for heat-dissipating substrates can be produced by satisfying the thermal conductivity and other properties required for the insulating layer.

According to this invention, the insulating layer is allowed to contain, in addition to heat conductive fillers, other organic additives such as processing aids, antioxidants, light stabilizers, flame retardants, antistatic agents, surfactants, dispersants, anti-settling agents, heat stabilizers, and ultraviolet absorbers or inorganic fillers.

As described above, the highly heat conductive metal-clad laminate of this invention naturally has a metal layer on one side of the insulating layer and it may have metal layers on both sides of the insulating layer. A metal-clad laminate having metal layers on both sides can be obtained by forming a metal-clad laminate having a metal layer on one side and then contact-bonding two of such laminates in a hot press while placing the polyimide resin sides face to face or by heat contact bonding a metal foil to the polyimide resin side of a metal-clad laminate having a metal layer on one side.

The metal layer in a highly heat conductive metal-clad laminate may be either a metal foil as described above or a film on which a metal is vapor-deposited. However, a metal foil, particularly a copper foil, is advantageous as it can be coated directly with a polyimide precursor containing a heat conductive filler. The thickness of the metal foil is controlled in the range of 5-100 μm, preferably in the range of 9-30 μm.

The highly heat conductive metal-clad laminate of this invention can be made particularly suitable for use in flexible board substrates requiring good flexing properties by controlling the thickness of the insulating layer or metal layer in the aforementioned range.

According to this invention, the method for producing a highly heat conductive polyimide film is not specifically limited and any of known methods can be adopted. For example, one method comprises forming a highly heat conductive metal-clad laminate and then removing the metal layer by etching. Another method comprises casting a polyamic acid solution containing a heat conductive filler onto an arbitrarily chosen support, drying the solution by heating on the support to form a self-supporting gel film, peeling off the gel film from the support, and imidizing the gel film at high temperatures to yield a polymide film.

EXAMPLES

This invention will be explained concretely with reference to the examples, but will not be limited to the scope of the examples.

The following symbols are used in the examples.
m-TB: 2,2'-Dimethyl-4,4'-diaminobiphenyl
TPE-R: 1,3-Bis(4-aminophenoxy)benzene
BAPP: 2,2-Bis(4-aminophenoxyphenyl)propane
PMDA: Pyromellitic dianhydride
BPDA: 3,3',4,4'-Biphenyltetracarboxylic acid dianhydride
DMAc: N,N-Dimethylacetamide Various properties were evaluated in the examples in accordance with the testing methods described below. The laminate in the examples is the one intended for a flexible board substrate and the film is the insulating layer obtained by removing the metal layer from the laminate.

[Thermal Conductivity in Direction of Thickness ($\lambda z$)]

A sample, 30 mm×30 mm in size, was cut from the film (insulating layer) and measured for the thermal diffusivity in the direction of thickness by the cyclic heat method (with the aid of an FTC-1 apparatus manufactured by Ulvac-Riko, Inc.), for the specific heat by DSC, and for the density by the gas substitution method, and the results of these measurements were used to calculate the thermal conductivity in the direction of thickness.

[Thermal Conductivity in Direction of Plane ($\lambda xy$)]

A sample, 30 mm×30 mm in size, was cut from the film and measured for the thermal diffusivity in the direction of plane by the laser heating ac method (with the aid of a Laser PIT apparatus manufactured by Ulvac-Riko, Inc.), for the specific heat by DSC, and for the density by the gas substitution method, and the results of these measurements were used to calculate the thermal conductivity in the direction of plane.

[Coefficient of Thermal Expansion (CTE)]

A sample, 3 mm×15 mm in size, cut from the film was stretched in an apparatus for thermomechanical analysis (TMA) with application of a load of 5 g at a constant rate of temperature rise of 20° C./min from 30° C. to 260° C. and the coefficient of thermal expansion was determined from the relationship between elongation of the film and temperature.

[Glass Transition Temperature (Tg)]

A sample (10 mm×22.6 mm) prepared from the film was heated from 20° C. to 500° C. at a rate of temperature rise of 5° C./min in a dynamic thermomechanical analyzer to measure the dynamic viscoelasticity and the glass transition temperature (tan δ maximum, ° C.) was obtained from the results of the measurement.

[Dielectric Constant]

A sample, 5 cm×5 cm in size, was prepared from the film and measured for the dielectric constant in a constant temperature and humidity chamber maintained at 23° C. and 50% RH with the aid of a microwave molecular orientation analyzer, Model MOA-6015, at a frequency of 15 GHz.

[Tear Propagation Resistance]

A sample, 63.5 mm×50 mm in size, was prepared from the film, a 12.7 mm-long cut was made in the sample, and the tear propagation strength was measured with the aid of a light load tear tester manufactured by Toyo Seiki Seisaku-sho, Ltd.

[Adhesive Strength]

A 1 mm-wide sample of the laminate was fixed to an aluminum plate by a double-sided adhesive tape with the resin side of the laminate facing the tape and the copper foil was peeled off at 180° angle at a rate of 50 mm/min in a tension tester to measure the peel strength.

[Warpage]

The condition of warpage developed in a sample (10 cm×10 cm) of the laminate was evaluated by visual observation. A warp of less than 10 mm was indicated as ○ while a warp of more than 10 mm was indicated as x.

[Solder Heat Resistance]

A circuit was formed on a laminate in the specified configuration and the sample thus prepared was immersed in a soldering bath for 30 seconds at various temperatures with the upper limit set at 400° C. while confirming the presence or absence of blistering. The maximum temperature at which no blistering occurred was taken as solder heat resistance. Hence, when a sample shows no blistering at 400° C., the solder heat resistance of the sample is 400° C. or above.

[Interline Resistivity]

A prescribed pattern was formed on a laminate and the sample thus prepared was washed with water and placed in a dryer at 90° C. to evaporate the water adhering to the surface of the sample. Measurement was made in a constant temperature and humidity chamber (23±3° C., 50±5% RH) with the aid of an electric resistance tester (Model R8340A, manufactured by Advantest Corporation) while applying a voltage of 500V for a period of 60 seconds.

[External Appearance]

The insulating layer (film) obtained by removing the metal layer from the laminate was observed visually. A sample on which agglomerates were formed or a sample which was uneven was indicated as x and a sample which was flat was indicated as ○.

Synthetic Example 1

In a 300-ml separable flask was placed 170 g of DMAc as a solvent and m-TB (12.73 g, 0.060 mole) and TPE-R (1.95 g, 0.007 mole) were dissolved in the DMAc with stirring under flow of nitrogen. Then, PMDA (11.46 g, 0.053 mole) and BPDA (3.86 g, 0.013 mole) were added. Thereafter, the solution was stirred at room temperature for 3 hours to allow the polymerization reaction to proceed and a brown viscous polyamic acid solution (P1) was obtained.

Synthetic Example 2

In a 300-ml separable flask was placed 170 g of DMAc as a solvent and BAPP (15.02 g, 0.037 mole) was dissolved in the DMAc with stirring under flow of nitrogen. Then, PMDA (17.73 g, 0.035 mole) and BPDA (0.55 g, 0.002 mole) were added. Thereafter, the solution was stirred at room temperature for 3 hours to allow the polymerization reaction to proceed and a brown viscous polyamic acid solution (P2) was obtained.

Example 1

A polyamic acid solution containing heat conductive fillers was prepared by mixing uniformly 200 parts by weight of the polyamic acid solution (P1) with a solid content of 15 wt %, 15 parts by weight of boron nitride (a commercial product of Showa Denko K.K.; tradename UHP-1, scaly, average length 8 μm) from which particles of 25 μm or more were removed by a particle classifier as a plate-like filler, and 15 parts by weight of alumina (a commercial product of Sumitomo Chemical Co., Ltd.; tradename AA-3, spherical, average particle diameter 3 μm) as a spherical filler in a centrifugal mixer. This polyamic acid solution was applied to a 12 μm-thick electrodeposited copper foil to a thickness after curing of 25 μm and dried by heating at 130° C. to remove the solvent. Then, the polyamic acid containing the fillers was heated in steps from 130° C. to 360° C. over a period of 30 minutes to form a highly heat conductive metal-clad laminate having an insulating layer or a layer of a polyimide resin in which the heat conductive fillers were dispersed. The contents of boron nitride and alumina in the insulating layer are respectively 25 wt % and 25 wt %; that is, the content of the total heat conductive fillers in the insulating layer is 50 wt %. Moreover, the polyamic acid solution containing the heat conductive fillers was free of heat conductive fillers of 25 μm or more.

In order to evaluate the properties of the insulating layer (film) of the highly heat conductive metal-clad laminate thus obtained, the copper foil was removed by etching to yield a film (F1) and the film was evaluated for the CTE, tear propagation resistance, glass transition temperature, and thermal conductivity. The results are shown in Table 2. Further, the properties of the highly heat conductive metal-clad laminate were evaluated and the results are shown in Table 3.

Example 2

The polyamic acid solution (P2) without incorporation of the fillers was applied to the copper foil, the same material as used in Example 1, to a thickness after curing of 2 μm and dried by heating at 130° C. to remove the solvent. Thereto was then applied the same polyamic acid solution containing the plate-like filler and the spherical filler as used in Example 1 to a thickness after curing of 21 μm and dried by heating at 130° C. to remove the solvent. Thereto was further applied the polyamic acid solution (P2) without incorporation of the fillers to a thickness after curing of 2 μm and dried by heating at 130° C. to remove the solvent. Thereafter, the whole was heated in steps from 130° C. to 360° C. over a period of 30 minutes to form a laminate which consists of the copper foil and three polyimide layers and is useful for a flexible substrate. The composition of the insulating layer is shown in Table 1, the results of evaluation of the film (F2) are shown in Table 2, and the results of evaluation of the properties of the highly heat conductive metal-clad laminate are shown in Table 3.

Example 3

The procedure of Example 1 was repeated with the exception of using 15 parts by weight of boron nitride (a commercial product of Denki Kagaku Kogyo Kabushiki Kaisha.; tradename HGPE, scaly, average length 4.5 μm) from which particles of 30 μm or more were removed by a particle classifier as a plate-like filler.

Example 4

The procedure of Example 1 was repeated with the exception of using 15 parts by weight of boron nitride (a commercial product of Denki Kagaku Kogyo Kabushiki Kaisha.; tradename HGP7, scaly, average length 2.5 μm) from which particles of 10 μm or more were removed by a particle classifier as a plate-like filler.

Comparative Example 1

The procedure of Example 1 was repeated with the exception of using 30 parts by weight of alumina (a commercial product of Sumitomo Chemical Co., Ltd; tradename AA-3, spherical, average particle diameter 3 μm) as a spherical filler and none of the plate-like filler.

Comparative Example 2

The procedure of Example 1 was repeated with the exception of using 30 parts by weight of boron nitride (a commercial product of Showa Denko K.K.; tradename UHP-1, scaly, average length 8 μm) as a plate-like filler and none of the spherical filler.

Comparative Example 3

The procedure of Example 2 was repeated with the exception of using 15 parts by weight of boron nitride (a commercial product of Showa Denko K.K.; tradename UHP-1, scaly, average length 8 μm) as purchased without particle classification. This boron nitride contains 2 wt % of particles of 32 μm or more.

TABLE 1

|  | Example | | | | Comparative example | | |
| --- | --- | --- | --- | --- | --- | --- | --- |
|  | 1 | 2 | 3 | 4 | 1 | 2 | 3 |
| Insulating layer | 1 layer | 3 layers | 1 layer | 1 layer | 1 layer | 1 layer | 3 layers |
| Content of filler (wt %) | | | | | | | |
| Plate-like filler | 25 | 25 | 25 | 25 | 0 | 50 | 25 |
| Spherical filler | 25 | 25 | 25 | 25 | 50 | 0 | 25 |
| Total | 50 | 50 | 50 | 50 | 50 | 50 | 50 |
| $D_L/D_R$ (μm) | 8/3 | 8/3 | 4.5/3 | 2.5/3 | —/3 | 8/— | 8/3 |
| Classification of plate-like filler | 25 μm | 25 μm | 30 μm | 10 μm | Not classified | Not classified | Not classified |

TABLE 2

|  | Example | | | | Comparative example | | |
| --- | --- | --- | --- | --- | --- | --- | --- |
| Properties of film | 1 | 2 | 3 | 4 | 1 | 2 | 3 |
|  | F1 | F2 | F3 | F4 | F5 | F6 | F7 |
| CTE (ppm/K) | 19 | 22 | 14.3 | 15.7 | 31 | 8 | 20 |
| Tear propagation resistance (kN/m) | 1.7 | 2.4 | 1.6 | 1.5 | 2.2 | 0.8 | 1.1 |
| Tg (° C.) | 354 | 361 | 348 | 350 | 352 | * | 380 |
| Dielectric constant | 3.576 | 3.293 | 3.885 | 4.178 | 4.287 | 2.257 | 2.831 |
| λxy (W/mK) | 3 | 2.8 | 3.8 | 3.5 | 1.1 | 4.7 | 1.5 |
| λz (W/mK) | 1.1 | 0.7 | 1.1 | 1.1 | 0.9 | 1.5 | 1.4 |

*Not measured due to brittleness of film

TABLE 3

|  | Example | | | | Comparative example | | |
| --- | --- | --- | --- | --- | --- | --- | --- |
| Properties of laminate | 1 | 2 | 3 | 4 | 1 | 2 | 3 |
| Warpage | ○ | ○ | ○ | ○ | X | X | ○ |
| External appearance | ○ | ○ | ○ | ○ | ○ | X | X |
| Adhesive strength(kN/m) | — | 0.88 | — | — | — | — | 0.72 |
| Solder heat resistance(° C.) | 400 | 380 | 400 | 400 | 400 | 400 | 400 |
| Interline resistivity(Ω) | — | 1.20E+12 | — | — | — | — | 8.90E+12 |

Industrial Applicability

The polyimide film of this invention shows excellent thermal conductivity properties, heat resistance, dimensional stability, workability, and adhesive properties and presents a flat surface. The highly heat conductive metal-clad laminate of this invention has an insulating layer which shows excellent thermal conductivity properties, heat resistance, and dimensional stability. When this metal-clad laminate is fabricated into a wiring board substrate or the like, the exposed insulating layer presents a flat surface. In consequence, the metal-clad laminate or the film is useful for heat-dissipating sheets, heat-dissipating substrates, or adhesive films in various devices; for example, most suitable areas of application include parts in office equipment such as printers and copying machines, portable or mobile small-sized communication instruments such as mobile phones, and household electrical appliances such as television sets, video equipment, DVD, refrigerators, and lighting equipment. Further, potential areas of application include devices requiring heat dissipation such as automotive parts, optical instruments, heat exchangers, and hard disk drive parts as information-recording materials (hard disk hub, hard disk substrate, magnetic head, suspension, actuator, and so forth). Still further, potential areas of application include LSI packages and other semiconductor devices, sensors, LED lamps, LED substrates, connectors, coil bobbins, condensers, speakers, and electromagnetic wave shields.

The invention claimed is:

1. A highly heat conductive metal-clad laminate having an insulating layer containing at least one layer of a heat conductive filler-filled polyimide resin and a metal layer on one or both sides of the insulating layer, wherein the content of the heat conductive filler in the layer of the filled polyimide resin is 20-80 wt %, the heat conductive filler contains a plate-like filler with an average length $D_L$ of 0.1-15 μm and a spherical filler with an average particle diameter $D_R$ of 0.05-10 μm, the average length $D_L$ and the average particle diameter $D_R$ satisfy the relationship $D_L>D_R/2$, no heat conductive filler of 30 μm or more is contained, the content of the spherical filler in the heat conductive filler is 25-70 wt %, the coefficient of thermal expansion of the insulating layer is in the range of 15-25 ppm/K, the thickness of the insulating layer is in the range of 10-50 μm, the thermal conductivity is 1.0 W/(m·K) or more in a thickness direction and 2.5 W/(m·K) or more in a planar direction of the insulating layer;
   wherein the plate-like filler is at least one kind selected from the group of aluminum oxide and boron nitride and the spherical filler is at least one kind selected from the group of aluminum oxide, fused silica, and aluminum nitride.

2. The highly heat conductive metal-clad laminate as described in claim 1 wherein the sum of the heat conductive plate-like filler with a length of 9 μm or more and the heat conductive spherical filler with a particle diameter of 9 μm or more accounts for 50 wt % or less of the total heat conductive filler.

3. The highly beat conductive metal-clad laminate as described in claim 1 wherein the glass transition temperature of the polyimide resin constituting the insulating layer is 300° C. or above.

4. The highly heat conductive metal-clad laminate as described in claim 1, wherein
- the plate-like filler is at least one kind selected from the group of aluminum oxide and boron nitride and the spherical filler is at least one kind selected from the group of aluminum oxide, fused silica, and aluminum nitride,
- the sum of the heat conductive plate-like filler with a length of 9 μm or more and the heat conductive spherical filler with a particle diameter of 9 μm or more accounts for 50 wt % or less of the total heat conductive filler, and
- the glass transition temperature of the polyimide resin constituting the insulating layer is 300° C. or above.

* * * * *